（12） United States Patent
Jeang et al.

(10) Patent No.: US 11,996,270 B2
(45) Date of Patent: May 28, 2024

(54) WAFER PROCESSING APPARATUS

(71) Applicant: Samsung Electronics Co., Ltd., Suwon-si (KR)

(72) Inventors: Eunhee Jeang, Paju-si (KR); Seongkeun Cho, Suwon-si (KR); Kyungrim Kim, Anyang-si (KR); Incheol Song, Hwaseong-si (KR); Jangwon Cho, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 152 days.

(21) Appl. No.: 17/401,443

(22) Filed: Aug. 13, 2021

(65) Prior Publication Data

US 2022/0216039 A1 Jul. 7, 2022

(30) Foreign Application Priority Data

Jan. 5, 2021 (KR) ........................ 10-2021-0000987

(51) Int. Cl.
*H01J 37/32* (2006.01)
*C23C 16/44* (2006.01)
(Continued)

(52) U.S. Cl.
CPC .. *H01J 37/32238* (2013.01); *H01J 37/32229* (2013.01); *H01J 37/32669* (2013.01);
(Continued)

(58) Field of Classification Search
CPC ......... H01J 37/32192–32311; H01J 37/32119;
H01J 37/32201; H01J 37/32211; H01J 37/3222; H01J 37/32229; H01J 37/32238; H01J 37/32256; H01J 37/32266; H01J 37/32275; H01J 37/32284;
(Continued)

(56) References Cited

U.S. PATENT DOCUMENTS 5,234,526 A * 8/1993 Chen ................. H01J 37/32192
118/252
5,433,789 A * 7/1995 Kakehi ................. C23C 16/511
118/723 MR
(Continued)

FOREIGN PATENT DOCUMENTS

JP 2760845 B2 6/1998
JP H1197198 A 4/1999
(Continued)

OTHER PUBLICATIONS

Quon, B.H. , et al., "Preferential electroncyclotron heating of hot electrons and formation of overdense plasmas", Phys. Fluids B 1, 2010 (1989), pp. 2010-2017.

*Primary Examiner* — Kurt Sweely
(74) *Attorney, Agent, or Firm* — Myers Bigel, P.A.

(57) ABSTRACT

A wafer processing apparatus includes a chamber body including a cavity region and a process region; a microwave waveguide configured to introduce a microwave into the cavity region; a first microwave window between the cavity region and the process region; and a magnetic field supplying device configured to apply a magnetic field inside the chamber body, wherein a thickness of the first microwave (Continued)

window is constant, and the first microwave window is configured to control a beam cross-section of the microwave in the process region.

16 Claims, 12 Drawing Sheets

(51) Int. Cl.
　　*C23C 16/455*　　(2006.01)
　　*C23C 16/511*　　(2006.01)
　　*H01L 21/67*　　(2006.01)
(52) U.S. Cl.
　　CPC .... *C23C 16/4404* (2013.01); *C23C 16/45565* (2013.01); *C23C 16/511* (2013.01); *H01J 37/3244* (2013.01); *H01J 37/3266* (2013.01); *H01L 21/67069* (2013.01)
(58) Field of Classification Search
　　CPC .......... H01J 37/32293; H01J 37/32477; H01J 37/3244; H01J 37/3266; H01J 37/32669; C23C 16/4404; C23C 16/45565; C23C 16/511; H01L 21/67069
　　See application file for complete search history.

(56) References Cited

U.S. PATENT DOCUMENTS

| | | | | |
|---|---|---|---|---|
| 5,466,991 | A * | 11/1995 | Berry | H01J 37/32678 315/111.41 |
| 5,858,162 | A * | 1/1999 | Kubota | H01J 37/3266 118/723 MR |
| 5,911,852 | A * | 6/1999 | Katayama | H01J 37/32266 118/723 ME |
| 6,361,707 | B1 | 3/2002 | Tanaka et al. | |
| 6,677,549 | B2 * | 1/2004 | Suzuki | H01J 37/32238 219/121.41 |
| 6,870,123 | B2 | 3/2005 | Suzuki et al. | |
| 7,015,413 | B2 | 3/2006 | Petrin et al. | |
| 7,210,424 | B2 | 5/2007 | Tolmachev et al. | |
| 9,305,795 | B2 * | 4/2016 | Kamada | H01J 37/32192 |
| 9,865,434 | B2 * | 1/2018 | Sun | C04B 41/87 |
| 2004/0221800 | A1 | 11/2004 | Yanase | |
| 2013/0164948 | A1 * | 6/2013 | Romero | C23C 16/52 257/E21.328 |
| 2019/0272981 | A1 | 9/2019 | Xu et al. | |

FOREIGN PATENT DOCUMENTS

| | | |
|---|---|---|
| JP | 2003068723 A | 3/2003 |
| JP | 2019110028 A | 7/2019 |

* cited by examiner

WAFER PROCESSING APPARATUS

CROSS-REFERENCE TO RELATED APPLICATION

This application is based on and claims priority under 35 U.S.C. § 119 to Korean Patent Application No. 10-2021-0000987, filed on Jan. 5, 2021, in the Korean Intellectual Property Office, the disclosure of which is incorporated by reference herein in its entirety.

BACKGROUND

The inventive concept relates to a wafer processing apparatus.

Semiconductor devices are formed using various semiconductor manufacturing processes like a material layer deposition process, an ion implantation process, a photolithography process, and an etching process. Recently, as semiconductor devices become highly integrated, the importance of the quality of material films and patterns constituting semiconductor devices is increasing. Therefore, a semiconductor device manufacturing process using plasma is on the spotlight, and examples thereof include a plasma annealing process, a plasma polymerization process, a sputtering process, a plasma-enhanced chemical vapor deposition (PECVD) process, and a plasma etching process. Depending on plasma generation methods, pieces of plasma equipment therefor include capacitively coupled plasma equipment, inductively coupled plasma equipment, helicon plasma equipment, surface wave plasma equipment, and electron cyclotron resonance (ECR) plasma equipment.

SUMMARY

The inventive concept provides a wafer processing apparatus having improved reliability.

According to an aspect of the inventive concept, there is provided a wafer processing apparatus. The wafer processing apparatus includes a chamber body including a cavity region and a process region; a microwave waveguide configured to introduce a microwave into the cavity region; a first microwave window interposed between the cavity region and the process region; and a magnetic field supplying device configured to apply a magnetic field inside the chamber body, wherein a thickness of the first microwave window is constant, and the first microwave window is configured to control a beam cross-section of the microwave in the process region.

According to another aspect of the inventive concept, there is provided a wafer processing apparatus. The wafer processing apparatus includes a chamber body including a cavity region into which a microwave is introduced and a process region in which electron cyclotron resonance (ECR) plasma is generated; a microwave window interposed between the cavity region and the process region; and a magnetic field supplying device configured to apply a magnetic field inside the chamber body to adjust a position where the ECR plasma is generated, wherein a refractive index of the microwave window varies according to a distance from an optical axis of the microwave window.

According to another aspect of the inventive concept, there is provided a wafer processing apparatus. The wafer processing apparatus includes a chamber body including a cavity region into which a microwave is introduced and a process region in which plasma is generated; a microwave window interposed between the cavity region and the process region and having formed thereon a transmittance adjusting coating, wherein a top surface and a bottom surfaces of the microwave window are substantially flat surfaces; and a magnetic field supplying device configured to apply a magnetic field inside the chamber body, wherein the transmittance adjusting coating includes a first portion having a first transmittance for the microwave and a second portion having a second transmittance for the microwave that is higher than the first transmittance.

BRIEF DESCRIPTION OF THE DRAWINGS

Embodiments of the inventive concept will be more clearly understood from the following detailed description taken in conjunction with the accompanying drawings in which.

DETAILED DESCRIPTION

Figure 1:
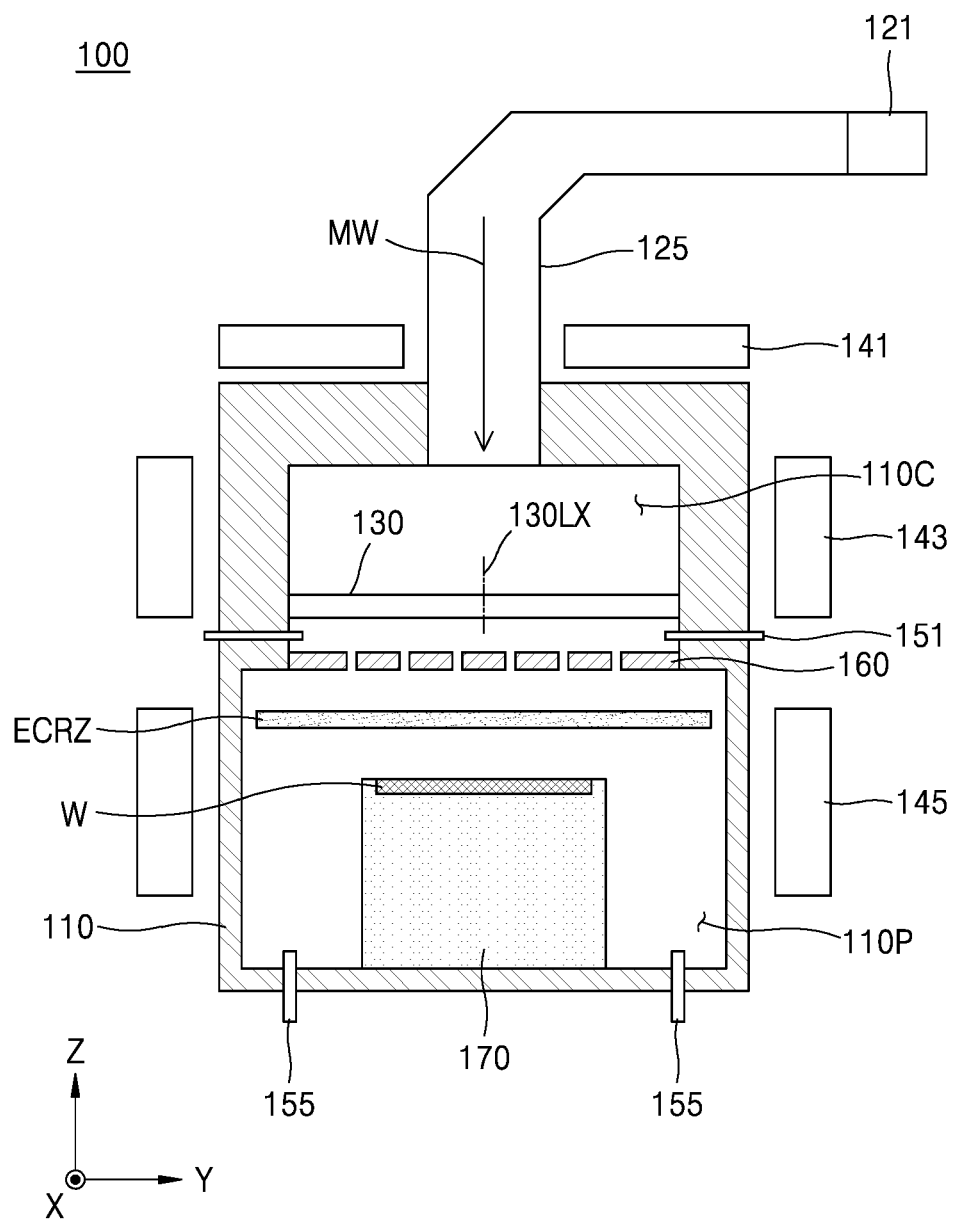
FIG. 1 is a diagram of a wafer processing apparatus according to example embodiments.

FIG. 1 is a diagram of a wafer processing apparatus 100 according to example embodiments.

Referring to FIG. 1, the wafer processing apparatus 100 may include a chamber body 110, a microwave source 121, a microwave waveguide 125, a microwave window 130, first to third magnetic field supplying devices 141, 143, and 145, a gas inlet 151, a gas exhaust 155, a shower head 160 and a wafer support 170.

The wafer processing apparatus 100 may be an apparatus that generates plasma and processes a wafer W by using the plasma. The wafer processing apparatus 100 may perform a plasma process including a plasma annealing process, a plasma polymerization process, a sputtering process, a plasma-enhanced chemical vapor deposition (PECVD) process, a plasma etching process, and a plasma cleaning process on the wafer W.

According to example embodiments, the wafer processing apparatus 100 may be electron cyclotron resonance (ECR) equipment. The wafer processing apparatus 100 generates plasma by resonating electrons inside the chamber body 110 by simultaneously applying a magnetic field and a microwave MW into the chamber body 110. ECR equipment may be referred to as an electrodeless plasma source, because the ECR equipment is capable of generating plasma without a current flowing to an electrode. Because an ECR plasma source is also microwave-based, plasma may be generated at a location away from a surface of a device element.

The chamber body 110 may provide or define an inner space for processing the wafer W. The chamber body 110 may isolate the inner space for processing the wafer W from the outside. The chamber body 110 may be clean room equipment capable of controlling a pressure and a temperature with high precision. The chamber body 110 may include a cavity region 110C to which a microwave is introduced and a process region 110P in which an ECR region ECRZ is formed and the wafer W is disposed. The cavity region 110C may be a portion of the chamber body 110 between the microwave waveguide 125 and the microwave window 130. The process region 110P may be a portion of the chamber body 110 disposed under the shower head 160. According to example embodiments, the cavity region 110C and the process region 110P may be rotationally symmetric around a Z direction, but the inventive concept is not limited thereto. The cavity region 110C and the process region 110P may each have a rectangular shape or a cylindrical shape.

The microwave source 121 may generate a microwave MW. The microwave source 121 may include a patch antenna, a dipole antenna, a monopole antenna, a microstrip antenna, a slot antenna, a Yagi-Uda antenna, etc. The microwave MW may have a frequency of, for example, 2.45 GHz or less. The microwave MW may have a frequency of, for example, 2.45 GHz. The microwave MW may travel along the microwave waveguide 125 in a transverse electric 11 (TE11) mode. The microwave MW may have a Gaussian-type spatial-intensity distribution in which the intensity of a center portion is high and the intensity of an edge portion is low on a beam cross-section.

The cavity region 110C may be a region through which the microwave MW transmitted along the microwave waveguide 125 is introduced into the chamber body 110. A stationary wave due to the microwave MW may be formed in the cavity region 110C. According to example embodiments, a microwave coupler or waveguide launcher may be further provided between the cavity region 110C and the microwave waveguide 125 to prevent generation of a reflected wave of the microwave MW.

The microwave MW may pass through the microwave window 130 and be introduced into the process region 110P. Here, a direction perpendicular to the top surface of the microwave window 130 is defined as the Z direction, and two directions parallel to the top surface of the microwave window 130 and perpendicular to each other are defined as an X direction and a Y direction, respectively. An optical axis 130LX of the microwave window 130 may be parallel to or coaxial with the Z direction. Hereinafter, the radius of the microwave window 130 refers to a horizontal distance (e.g., a radial distance) from the optical axis 130LX of the microwave window 130.

Here, for example, an optical axis of a particular optical element like the optical axis 130LX of the microwave window 130 may be an axis around which the particular optical element is rotationally symmetric. An optical axis may be a straight line connecting the centers of optical surfaces included in an optical element like a lens or a mirror. Therefore, for any optical element included in an optical system, even when the optical element is rotated at an arbitrary angle around the optical axis of the optical element, the optical system may be optically identical to the optical system before rotation.

According to example embodiments, the inner space of the chamber body 110 and the microwave window 130 may have rotational symmetry around an axis parallel to the Z direction, but the inventive concept is not limited thereto. For example, the inner space of the chamber body 110 may include a cylindrical portion, and the microwave window 130 may have a disk-like shape.

The top surface and the bottom surface of the microwave window 130 may be substantially flat. The thickness of the microwave window 130 in the Z direction may be substantially constant throughout the microwave window 130, but the inventive concept is not limited thereto.

The microwave window 130 may include a dielectric material. The microwave window 130 may include a material transparent to the microwave MW. The microwave window 130 may include, for example, quartz. According to example embodiments, the thickness of the microwave window 130 may be less than the wavelength of the microwave MW. According to example embodiments, the thickness of the microwave window 130 may be within the range from about 10 mm to about 100 mm. According to example embodiments, the thickness of the microwave window 130 may be about 5 mm or less.

According to example embodiments, the microwave window 130 may have a variable refractive index. According to example embodiments, the microwave window 130 may be a gradient-index lens. According to example embodiments, the microwave window 130 may have a refractive index that varies according to a radius of the microwave window 130 from the optical axis 130LX. According to example embodiments, the refractive index of the microwave window 130 may be determined according to Equation 1 below.

$$n(r) = n_0 + \frac{1}{f \cdot t} r^2 \qquad \text{[Equation 1]}$$

Here, n(r) denotes the refractive index of the microwave window 130 according to a radius r, f denotes a focal length, t denotes the thickness of the microwave window 130 in the Z direction, and no denotes the refractive index of the microwave window 130 along the optical axis 130LX.

Equation 1 above is a thin lens equation, and, when the microwave MW has a frequency of 2.45 GHz, the wavelength thereof is about 12.24 cm. Therefore, because the thickness of the microwave window 130 is less than the wavelength of the microwave MW, Equation 1 above may be applied to the microwave window 130.

According to example embodiments, the microwave window 130 may be a concave lens, and in this case, the focal length of the microwave window 130 may be from about −1000 mm to about −100 mm. According to example embodiments, the microwave window 130 may be a convex lens, and in this case, the focal length of the microwave window 130 may be from about 100 mm to about 1000 mm.

According to example embodiments, the microwave window 130 may adjust a space-intensity distribution of the microwave MW. According to example embodiments, the microwave window 130 may uniformly change the space-intensity distribution of the microwave MW.

Previously, the uniformity of a process between the center and the edge of the wafer W (e.g., a difference between etching amounts or a difference between thicknesses of deposited material films) is secured by adjusting a distance between the location of the ECR region ECRZ and the wafer W. However, when the distance between the ECR region ECRZ and the wafer is greater than certain distance such that the uniformity of a process between the center and the edge of the wafer W is equal to or greater than a certain level, a process speed for the wafer W (e.g., an etching speed or a deposition rate) is lowered. In other words, in a previous wafer processing apparatus based on ECR, the speed of a process for the wafer W and the uniformity of a process are in a trade-off relationship.

According to example embodiments, by providing the microwave window 130 having a variable refractive index according to a radius, the ECR region ECRZ may be formed close to the wafer W, and thus, the wafer W may be processed at a high speed and the uniformity of processing the wafer W may be improved. Therefore, the reliability and productivity of manufacturing a semiconductor device may be improved.

Hereinafter, the effect of the microwave window 130 according to example embodiments will be described in more detail with reference to FIG. 2.

Figure 2A:
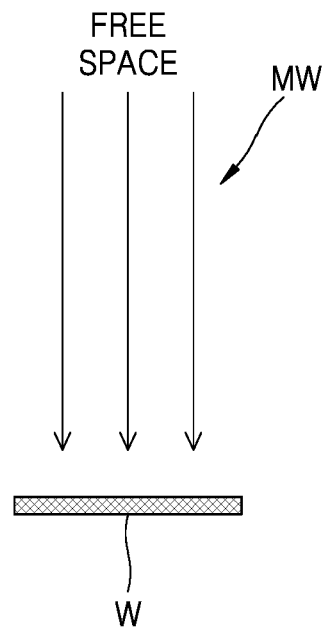
FIGS. 2A to 2C are diagrams for describing an effect of a microwave window according to example embodiments.
Figure 2B:
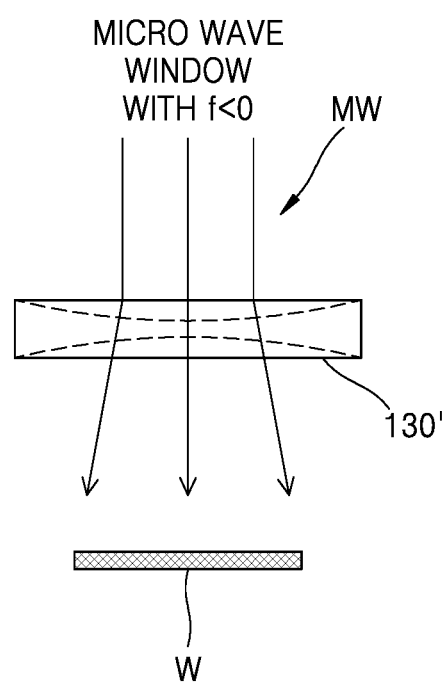
Figure 2C:
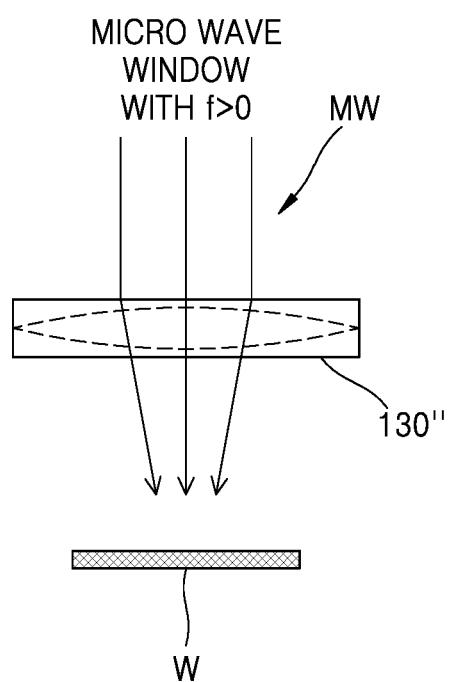

FIGS. 2A to 2C are diagrams for describing an effect of the microwave window 130 according to example embodiments.

FIG. 2A shows, as a comparative example, propagation of the microwave MW in a free space without the microwave window 130. In this case, the microwave MW may propagate through the free space on the wafer W, and an electric magnetic field of the TE11 mode is formed on the wafer W. Therefore, the spatial distribution of plasma formed on the wafer W becomes non-uniform in the ECR region ECRZ, thereby resulting in deterioration and/or failure of a semiconductor device.

Referring to FIG. 2B, a microwave window 130' of a first experimental example and propagation of the microwave MW according to the same are shown. The broken line inside represents an equivalent lens according to a change in the refractive index of the microwave window 130'.

According to example embodiments, the equivalent lens of the microwave window 130' may be a concave lens having a focal length less than 0. The microwave window 130' may control the beam cross-section of the microwave MW. The microwave window 130' may increase the beam cross-section of the microwave MW. The microwave MW passing through the microwave window 130' functioning as a concave lens may be dispersed, thereby improving the uniformity of plasma distribution formed on the wafer W. Therefore, the reliability of processing the wafer W may be improved.

Referring to FIG. 2C, a microwave window 130" of a second experimental example and propagation of the microwave MW according to the same are shown. The broken line inside represents an equivalent lens according to a change in the refractive index of the microwave window 130".

According to example embodiments, the equivalent lens of the microwave window 130" may be a convex lens having a focal length greater than 0. The microwave window 130" may control the beam cross-section of the microwave MW. The microwave window 130" may reduce the beam cross-section of the microwave MW. The microwave MW that has passed through the microwave window 130" functioning as a convex lens may be focused.

A previous microwave window is manufactured to have a lens-like shape, but has a rough surface due to the limitation of lens processing. The roughness on a surface of the microwave window causes adverse effects like particle contamination and arc generation along with plasma, which may cause product defects.

According to example embodiments, by changing the refractive index according to a radius, the microwave window 130 (refer to FIG. 1) including smooth surfaces may function as a lens, thereby preventing product defects due to the limitation of processing the surfaces of the microwave window 130 (refer to FIG. 1) and improving the reliability of the wafer W (refer to FIG. 1).

Referring back to FIG. 1, the first to third magnetic field supplying devices 141, 143, and 145 may form a magnetic field inside the chamber body 110. The first to third magnetic field supplying devices 141, 143, and 145 may be arranged outside the cavity region 110C and the process region 110P. The magnetic field formed by the first to third magnetic field supplying devices 141, 143, and 145 may apply Lorentz force to electrons inside the process region 110P, and thus, the electrons may rotate around the Z direction. At this time, when the rotation frequency of the electrons is identical to the frequency of the microwave MW, plasma may be generated by ECR. For example, when the frequency of the microwave MW is 2.45 GHz, ECR occurs at a position where the intensity of a magnetic field is 875 Gauss (G). The ECR region ECRZ may be a region in which plasma is generated by ECR. The ECR region ECRZ may be a region having the highest plasma concentration in the chamber body 110.

According to example embodiments, each of the first to third magnetic field supplying devices 141, 143, and 145 may be one of a coil (i.e., an electromagnet) and a permanent magnet. According to example embodiments, some of the first to third magnetic field supplying devices 141, 143, and 145 may be coils and the remaining one(s) may be permanent magnets. According to example embodiments, when at least one of the first to third magnetic field supplying devices 141, 143, and 145 is a coil, a location at which ECR occurs may be controlled by adjusting a current applied to the at least one coil.

FIG. 1 shows an example in which three magnetic field supplying devices, for example, the first to third magnetic field supplying devices 141, 143, and 145, are provided. However, this is merely an example, and the inventive concept is not limited thereto. For example, the wafer processing apparatus 100 may include one, two, four or more magnetic field supplying devices.

According to some embodiments, the gas inlet 151 may be provided between the microwave window 130 and the shower head 160. The gas inlet 151 may supply process gas into the chamber body 110. The process gas may include a material to be deposited or may be a source gas for generating reactive ions. The type and the pressure of the process gas may vary depending on the composition of a material layer to be deposited or a material layer to be etched.

The gas exhaust 155 may be connected to a pump like a turbo molecular pump and a dry pump and may adjust the pressure inside the chamber body 110. Here, the turbo molecular pump is a type of vacuum pump similar to a turbo pump and may secure and maintain a vacuum. The turbo molecular pump may include, for example, a fast rotating fan rotor. The turbo molecular pump may provide a high vacuum pressure by controlling a magnitude and a direction of the momentum of gas molecules by using the fan rotor. Unlike an oil diffusion pump, the dry pump may not include oil that performs sealing and lubricating functions to maintain a vacuum formed in a process chamber. The dry pump may provide a vacuum of about $10^{-2}$ mbar and exhibit highly clean vacuum. The dry pump may include, for example, any one of a claw pump, a multi-stage roots pump, a roots-claw combination pump, a scroll pump, a screw pump, a diaphragm pump, and a molecular drag pump.

The shower head 160 may be provided between the gas inlet 151 and the process region 110P. The shower head 160 may uniformly introduce a process gas into the process region 110P. The shower head 160 may include a plurality of fine apertures configured to diffuse the process gas.

The wafer support 170 may support the wafer W. The wafer support 170 may include an electrostatic chuck that fixes the wafer W by using electrostatic force. A heater for setting the temperature of the wafer W may be provided inside the wafer support 170.

The wafer W may include, for example, silicon (Si). The wafer W may include a semiconductor element like germanium (Ge) or a compound semiconductor like silicon carbide (SiC), gallium arsenide (GaAs), indium arsenide (InAs), and indium phosphide (InP). According to some embodiments, the wafer W may have a silicon-on-insulator (SOI) structure. The wafer W may include a buried oxide layer. According to some embodiments, the wafer W may include a conductive region, e.g., a well doped with impurities. According to some embodiments, the wafer W may have various device isolation structures like a shallow trench isolation (STI) separating doped wells from one another. The wafer W may have a first surface, which is an active surface, and a second surface, which is an inactive surface opposite to the first surface. The wafer W may be disposed on the wafer support 170, such that the second side thereof faces the wafer support 170.

Figure 3:
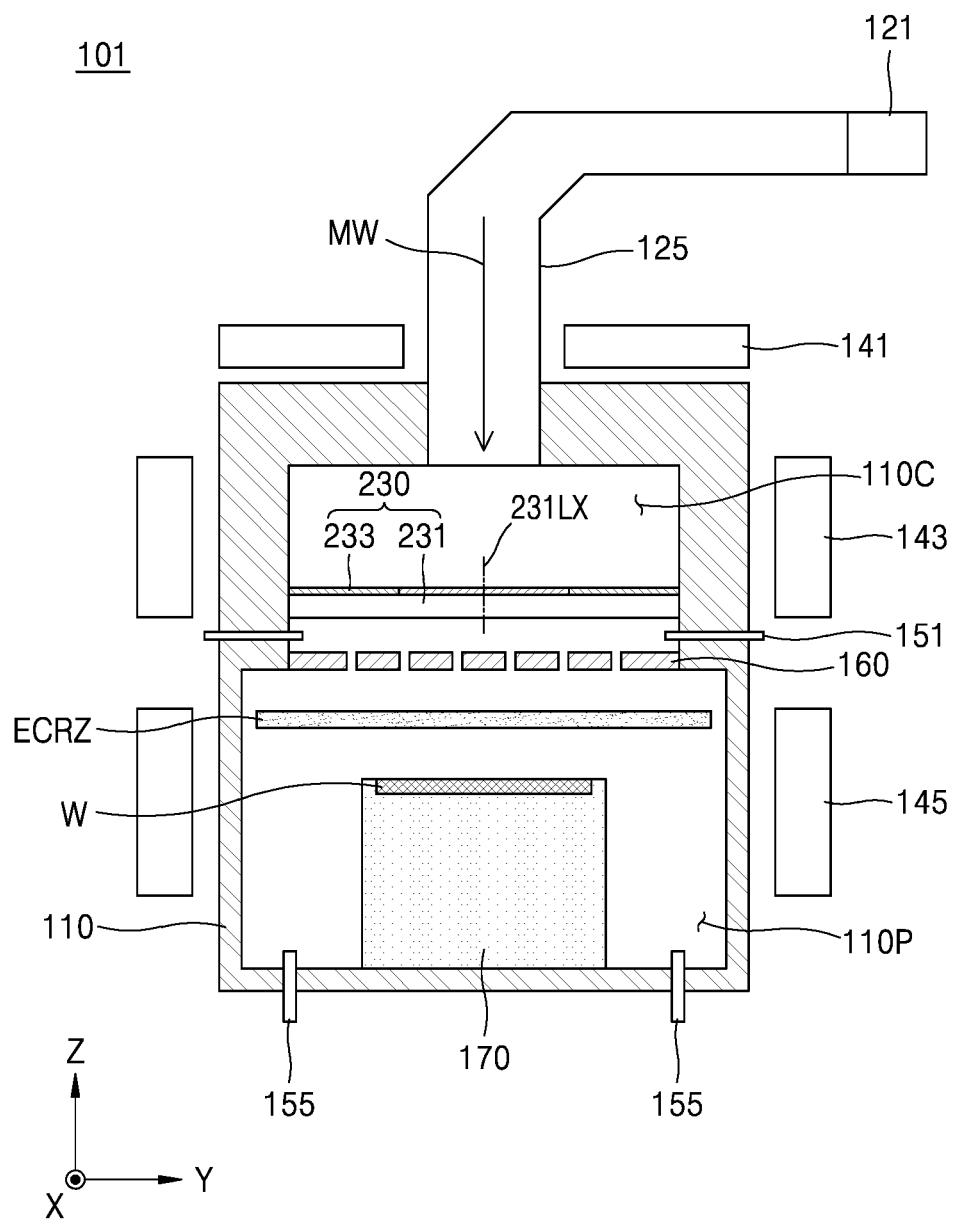
FIG. 3 is a diagram of a wafer processing apparatus according to example embodiments.

FIG. 3 is a diagram of a wafer processing apparatus according to example embodiments.

For convenience of explanation, descriptions identical to those already given above with reference to FIG. 1 may be omitted, and descriptions below will focus on differences therefrom.

Referring to FIG. 3, a wafer processing apparatus 101 may include the chamber body 110, the microwave source 121, the microwave waveguide 125, a microwave window 230, the first to third magnetic field supplying devices 141, 143, and 145, the gas inlet 151, the gas exhaust 155, the shower head 160, and the wafer support 170.

The microwave window 230 may include a refractive index adjuster 231 and a transmittance adjusting coating 233. The refractive index adjuster 231 may be substantially the same as the microwave window 130 of FIG. 1. The transmittance adjusting coating 233 may have a transmittance depending on a distance from an optical axis 231LX of the refractive index adjuster 231. A thickness (i.e., a length in the Z direction) of the transmittance adjusting coating 233 may be within a range from about 0.1 mm to about 50 mm.

Although FIG. 3 shows that the transmittance adjusting coating 233 is formed on the top surface of the microwave window 230 (i.e., the surface facing the cavity region 110C), the inventive concept is not limited thereto. The transmittance adjusting coating 233 may also be formed on the bottom surface of the microwave window 230 (i.e., the surface facing the process region 110P).

Here, with reference to FIG. 4A, the transmittance adjusting coating 233 will be described in more detail.

Figure 4A:
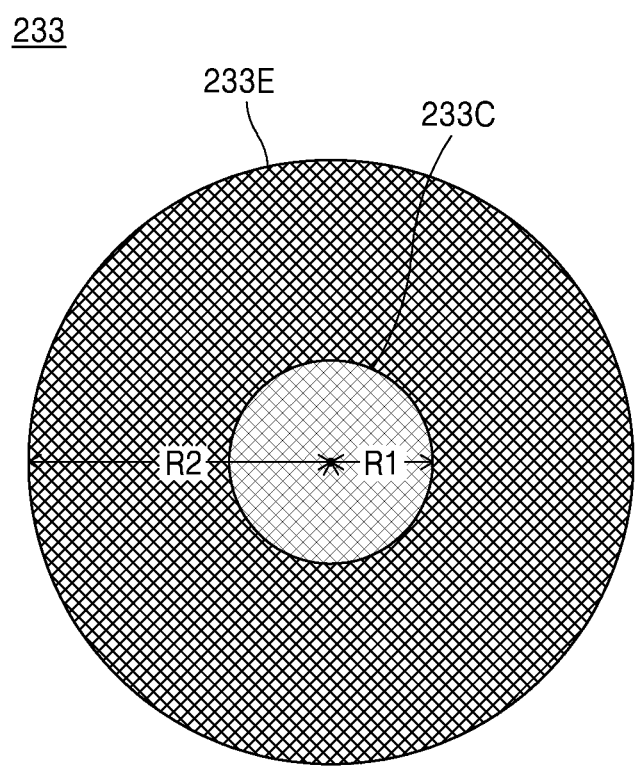
FIG. 4A is a plan view of a transmittance adjusting coating according to example embodiments.

FIG. 4A is a plan view of the transmittance adjusting coating 233 according to example embodiments.

Referring to FIGS. 3 and 4A, the transmittance adjusting coating 233 may include a center portion 233C and an edge portion 233E. The center portion 233C and the edge portion 233E may be optically distinguished from each other. The center portion 233C and the edge portion 233E may have different transmittances for the microwave MW.

The center portion 223C may be a circular region having a first radius R1. The edge portion 233E may be a ring-shaped or annular region surrounding the center portion 223C. The edge portion 233E may have the first radius R1 as an inner radius and a second radius R2 greater than the first radius R1 as an outer radius.

For example, a first transmittance of the center portion 233C for the microwave MW may be lower than a second transmittance of the edge portion 233E for the microwave MW. In this case, because the power at the center of the microwave MW may be reduced, the uniformity of a plasma density of the ECR region ECRZ may be improved. However, the inventive concept is not limited thereto, and the first transmittance of the center portion 233C may be greater than the second transmittance of the edge portion 233E.

Figure 4B:
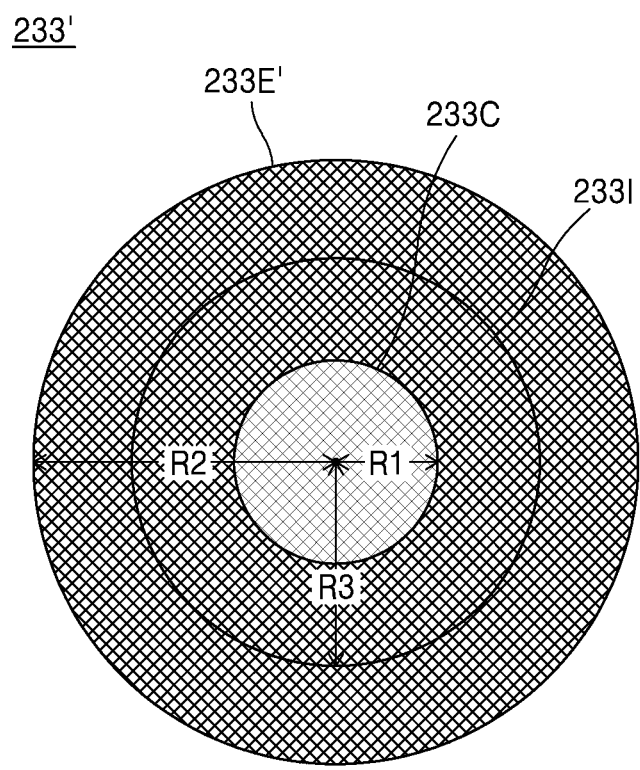
FIG. 4B is a plan view of a transmittance adjusting coating according to example embodiments.

FIG. 4B is a plan view of a transmittance adjusting coating 233' according to example embodiments.

For convenience of explanation, descriptions identical to those already given above with reference to FIG. 4A may be omitted, and descriptions below will focus on differences therefrom.

Referring to FIGS. 3 and 4A, the transmittance adjusting coating 233' may include a center portion 233C and an edge portion 233E' and may further include an intermediate portion 233I. The center portion 233C, the edge portion 233E', and the intermediate portion 233I may be optically distinguished from one another. The center portion 233C, the edge portion 233E', and the intermediate portion 233I may have different transmittances for the microwave MW.

The center portion 223C may be a circular region having a first radius R1. The intermediate portion 233I may be a ring-shaped or annular region surrounding the center portion 223C, and the edge portion 233E' may be a ring-shaped or annular region surrounding the intermediate portion 233I. The intermediate portion 233I may have the first radius R1 as an inner radius and a third radius R3 greater than the first radius R1 as an outer radius. The edge portion 233E' may have the third radius R3 as the inner radius and the second radius R2 greater than the third radius R3 as the outer radius.

For example, the first transmittance of the center portion 233C for the microwave MW may be lower than a third transmittance of the intermediate portion 233I for the microwave MW, and the third transmittance may be lower than the second transmittance of the edge portion 233E' for the microwave MW. In another example, the first transmittance may be greater than the third transmittance, and the third transmittance may be greater than the second transmittance.

Figure 4C:
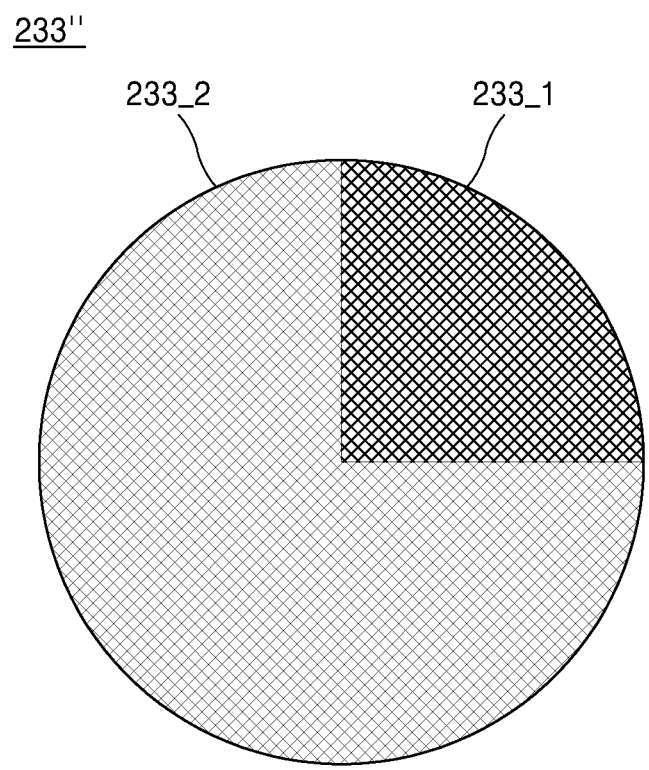
FIG. 4C is a plan view of a transmittance adjusting coating according to example embodiments.

FIG. 4C is a plan view of a transmittance adjusting coating 233" according to example embodiments.

For convenience of explanation, descriptions identical to those already given above with reference to FIG. 4A may be omitted, and descriptions below will focus on differences therefrom.

Referring to FIG. 4C, the transmittance adjusting coating 233" may include a first portion 233_1 and a second portion 233_2. The first portion 233_1 and the second portion 233_2 may be optically distinguished from each other. The first portion 233_1 and the second portion 233_2 may have different transmittances for the microwave MW.

According to example embodiments, the first portion 233_1 and the second portion 233_2 may be arbitrary geometric regions that divide the transmittance adjusting coating 233". According to example embodiments, the transmittance adjusting coating 233" may not have rotational symmetry. The first portion 233_1 and the second portion 233_2 may be determined based on equipment asymmetry of the wafer processing apparatus 101 (refer to FIG. 3).

For example, when an optical window is not provided, a plasma density of a portion of the ECR region ECRZ overlapping the first portion 233_1 in the Z direction may be greater than a plasma density of a portion of the ECR region ECRZ overlapping the second portion 233_2 in the Z direction, due to the equipment asymmetry of the wafer processing apparatus 101 (refer to FIG. 3). Correspondingly, the first portion 233_1 may have a transmittance lower than that of the second portion 233_2 for the microwave MW.

The transmittance adjusting coating 233" according to example embodiments may include portions configured as arbitrary geometric shapes based on equipment asymmetry of a wafer processing apparatus. Accordingly, the equipment asymmetry of the wafer processing apparatus may be corrected, thereby improving the reliability of manufacturing a semiconductor device.

Figure 4D:
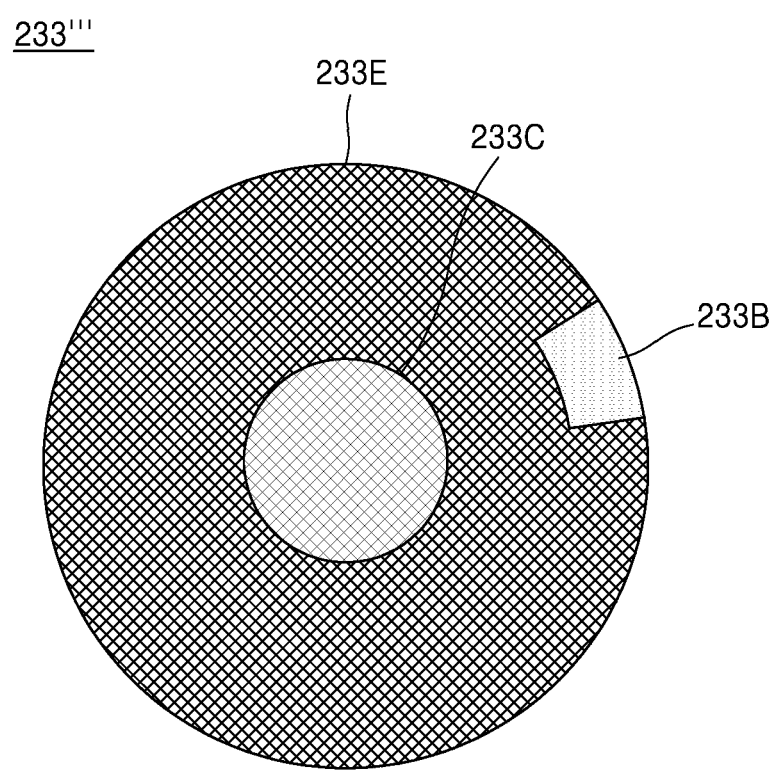
FIG. 4D is a plan view of a transmittance adjusting coating according to example embodiments.

FIG. 4D is a plan view of a transmittance adjusting coating 233''' according to example embodiments.

For convenience of explanation, descriptions identical to those already given above with reference to FIG. 4A may be omitted, and descriptions below will focus on differences therefrom.

Referring to FIG. 4D, the transmittance adjusting coating 233''' may include the center portion 233C and the edge portion 233E, similar to the transmittance adjusting coating 233 of FIG. 4A. According to example embodiments, the transmittance adjusting coating 233''' may further include a microwave shield 233B that blocks the microwave MW. The microwave shield 233B may block the microwave MW through any one of reflection and absorption.

The transmittance adjusting coating 233" according to example embodiments may include portions configured as arbitrary geometric shapes to block the microwave MW (refer to FIG. 3) at a portion with a high plasma density, based on the equipment asymmetry of the wafer processing apparatus 101 (refer to FIG. 3). Accordingly, the equipment asymmetry of the wafer processing apparatus 101 (refer to FIG. 3) may be corrected, thereby improving the reliability of manufacturing a semiconductor device.

Figure 5:
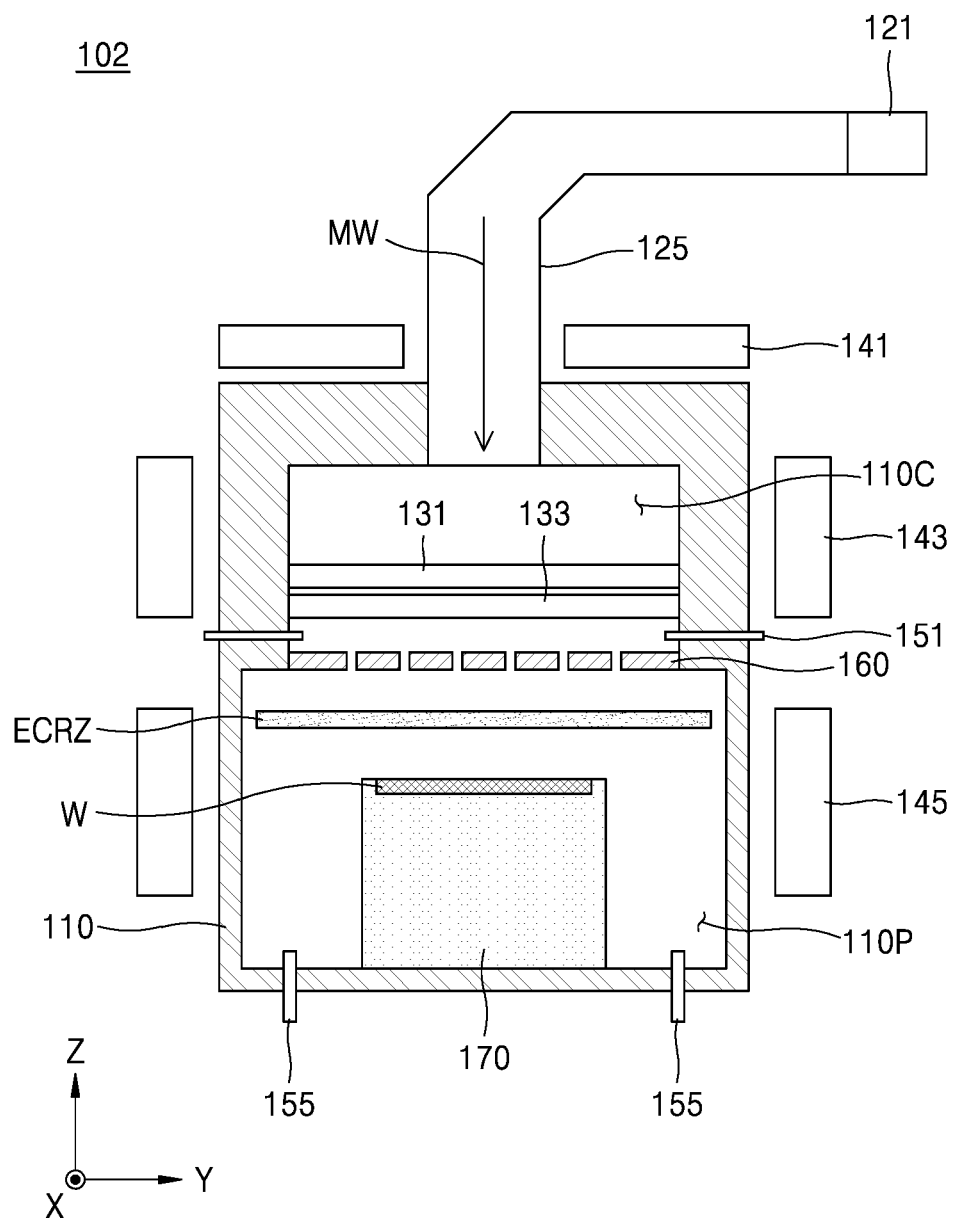
FIG. 5 is a diagram of a wafer processing apparatus according to example embodiments.

FIG. 5 is a diagram of a wafer processing apparatus 102 according to example embodiments.

For convenience of explanation, descriptions identical to those already given above with reference to FIG. 1 may be omitted, and descriptions below will focus on differences therefrom.

Referring to FIG. 5, the wafer processing apparatus 102 may include the chamber body 110, the microwave source 121, the microwave waveguide 125, a first microwave window 131, a second microwave window 133, the first to third magnetic field supplying devices 141, 143, and 145, the gas inlet 151, the gas exhaust 155, the shower head 160, and the wafer support 170.

According to example embodiments, the first microwave window 131 and the second microwave window 133 may each have an overall constant thickness (i.e., a length in the Z direction). According to example embodiments, the top surfaces and the bottom surfaces of the first microwave window 131 and the second microwave window 133 may be substantially flat. According to example embodiments, each of the first microwave window 131 and the second microwave window 133 may adjust the distribution of the intensity of the microwave MW in the process region 110P. Each of the first microwave window 131 and the second microwave window 133 may have a refractive index depending on a distance from each optical axis, similar to the microwave window 130 of FIG. 1.

According to example embodiments, the first microwave window 131 and the second microwave window 133 may form a collimating lens together. For example, the first microwave window 131 may function as a concave lens having a focal length less than 0, similar to the microwave window 130' of FIG. 2B, and the second microwave window 133 may function as a convex lens having a focal length greater than 0, similar to the microwave window 130" of FIG. 2C. In another example, the first microwave window 131 may function as a convex lens having a focal length greater than 0, similar to the microwave window 130" of FIG. 2C, and the second microwave window 133 may function as a concave lens having a focal length less than 0, similar to the microwave window 130' of FIG. 2B.

According to example embodiments, by providing a plurality of microwave windows, for example, the first and second microwave windows 131 and 133, having different optical functions, the distribution of the microwave MW in the process region 110P may be adjusted, and thus the reliability of manufacturing a semiconductor device may be improved.

Figure 6:
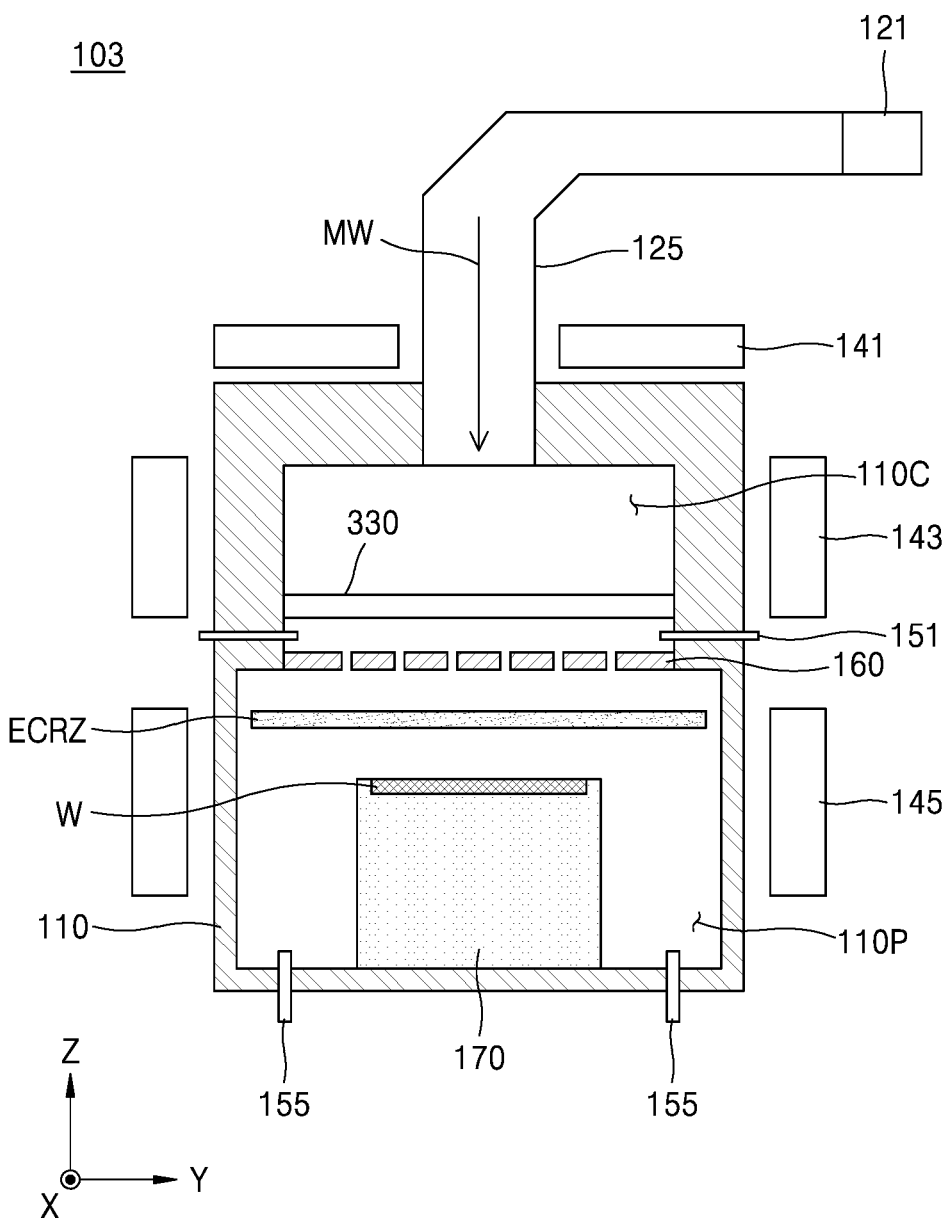
FIG. 6 is a diagram of a wafer processing apparatus according to example embodiments.

FIG. 6 is a diagram of a wafer processing apparatus 103 according to example embodiments.

Figure 7:
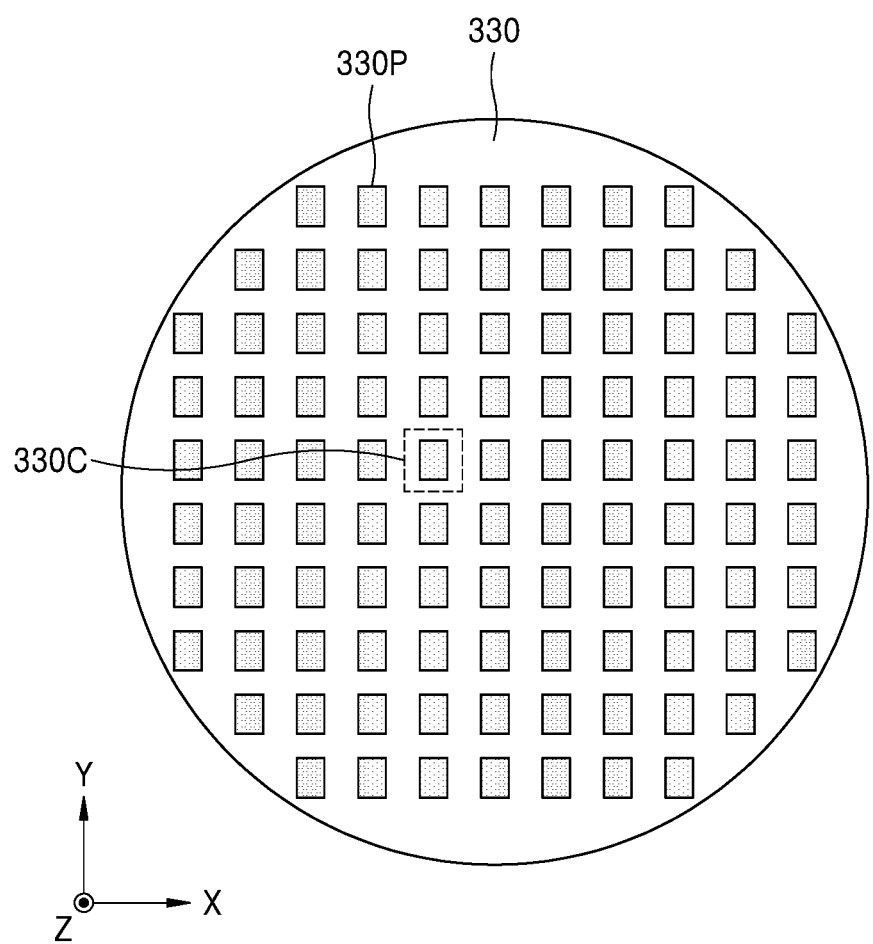
FIG. 7 is a plan view of a microwave window included in the wafer processing apparatus of FIG. 6.

FIG. 7 is a plan view of a microwave window 330 included in the wafer processing apparatus 103 of FIG. 6.

For convenience of explanation, descriptions identical to those already given above with reference to FIG. 1 may be omitted, and descriptions below will focus on differences therefrom.

Referring to FIGS. 6 and 7, the wafer processing apparatus 103 may include the chamber body 110, the microwave source 121, the microwave waveguide 125, the microwave window 330, the first to third magnetic field supplying devices 141, 143, and 145, the gas inlet 151, the gas exhaust 155, the shower head 160, and the wafer support 170.

According to example embodiments, the microwave window 330 may be a substantially flat lens including a nano structure for focusing a beam, e.g., a meta lens. For example, when the microwave window 330 is a meta lens, patterns 330P for configuring the meta lens may be formed on the top surface or the bottom surface of the microwave window 330. In some cases, the patterns 330P for configuring a meta lens may be formed on both the top surface and the bottom surface of the microwave window 330. The patterns 330P include the same material as the microwave window 330 and may be integrally formed with the microwave window 330. However, the inventive concept is not limited thereto, and the patterns 330P may include a material different from that constituting the microwave window 330. According to example embodiments, the patterns 330P may include $TiO_2$ or Au.

According to example embodiments, the patterns 330P may be arranged in the X direction and the Y direction to form a matrix. The microwave window 330 may be divided into a plurality of unit cells 330C having edges parallel to or along the X direction and the Y direction, and the patterns 330P may be formed inside the unit cells 330C, respectively. Lengths of each of the unit cells 330C in the X direction and the Y direction may be within a range from about 1/10 to about 1/100 of the wavelength of the microwave MW.

Although FIG. 7 shows that the patterns 330P have a substantially rectangular and planar shape, this is merely for convenience of explanation and the inventive concept is not limited thereto. The patterns 330P may have various shapes like a circular shape, a ring shape, an oval shape, an arbitrary polygonal shape, a cross shape, a straight shape, and a star shape.

According to example embodiments, the height of the patterns 330P in the Z direction may be within a range from about 1/1000 to 1/100 of the wavelength of the microwave MW. Therefore, variations in the height of a concavo-convex portion of the microwave window 330 due to the patterns 330P is about 1% or less of the total thickness of the microwave window 330, and the microwave window 330 may be considered to have a substantially constant thickness.

Figure 8:
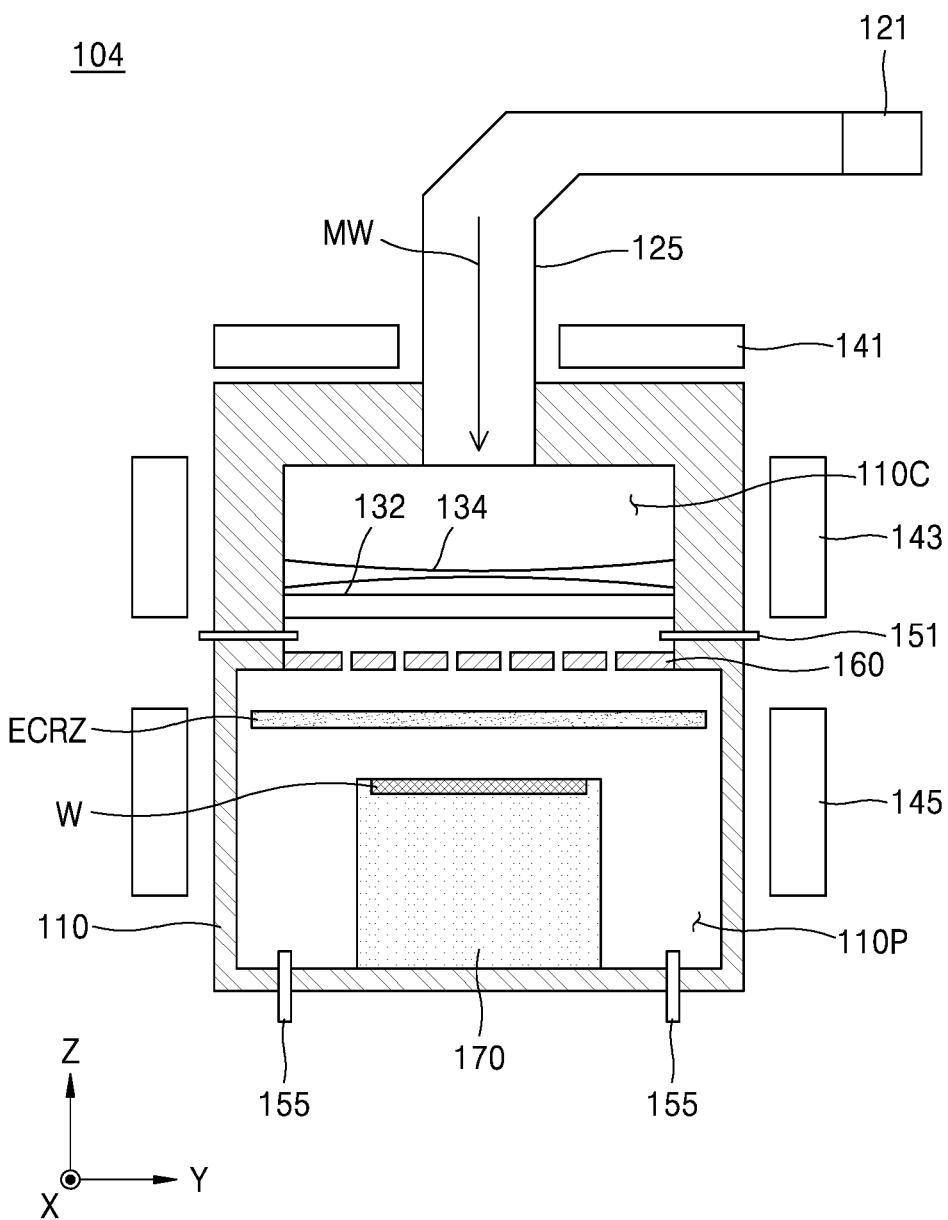
FIG. 8 is a diagram of a wafer processing apparatus according to example embodiments.

FIG. 8 is a diagram of a wafer processing apparatus 104 according to example embodiments.

For convenience of explanation, descriptions identical to those already given above with reference to FIG. 1 may be omitted, and descriptions below will focus on differences therefrom.

Referring to FIG. 8, the wafer processing apparatus 104 may include the chamber body 110, the microwave source 121, the microwave waveguide 125, a microwave window 132, a lens 134, the first to third magnetic field supplying devices 141, 143, and 145, the gas inlet 151, the gas exhaust 155, the shower head 160, and the wafer support 170.

According to some embodiments, the microwave window 132 may be substantially the same as the microwave window 130 of FIG. 1. In addition to the microwave window 132, the wafer processing apparatus 104 further includes the lens 134 for adjusting the distribution of the intensity of the microwave MW in the process region 110P, and the precision of adjusting the distribution of the intensity of the microwave MW in the process region 110P may be improved. Therefore, the reliability of the wafer processing apparatus 104 may be improved. Also, because no plasma is formed in the cavity region 110C, particle contamination and an arc may not be generated even when the lens 134 including a curved surface is provided in the cavity region 110C.

According to some other embodiments, the microwave window 132 may have an overall uniform refractive index. In this case, only the lens 134 including a curved surface may control the distribution of the intensity of the microwave MW.

While the inventive concept has been particularly shown and described with reference to embodiments thereof, it will be understood that various changes in form and details may be made therein without departing from the scope of the following claims.

What is claimed is:

1. A wafer processing apparatus comprising:
a chamber body including a cavity region and a process region;
a microwave waveguide configured to introduce a microwave into the cavity region of the chamber body;
a first microwave window between the cavity region and the process region of the chamber body;
a showerhead between the first microwave window and the process region of the chamber body; and
a magnetic field supplying device configured to apply a magnetic field inside the chamber body,
wherein a thickness of the first microwave window is constant,
the first microwave window is configured to control a beam cross-section of the microwave in the process region of the chamber body,
the first microwave window comprises a circular region and a ring-shaped region surrounding the circular region,
the first microwave window further comprises a transmittance adjusting coating thereon, and
a transmittance of the transmittance adjusting coating on the circular region of the first microwave window is different from a transmittance of the transmittance adjusting coating on the ring-shaped region of the first microwave window.

2. The wafer processing apparatus of claim 1, wherein a refractive index of the first microwave window varies according to a distance from a first optical axis, which is an optical axis of the first microwave window.

3. The wafer processing apparatus of claim 2, wherein the refractive index of the first microwave window according to the distance from the first optical axis is according to the following equation, $$n(r) = n_0 + \frac{1}{f \cdot t} r^2$$

where r denotes a distance from the first optical axis, n(r) denotes the refractive index of the first microwave window according to the distance r, f denotes a focal length of the first microwave window, t denotes the thickness of the first microwave window, and n0 denotes a refractive index of the first microwave window along the first optical axis.

4. The wafer processing apparatus of claim 1, wherein the thickness of the first microwave window is less than a wavelength of the microwave.

5. The wafer processing apparatus of claim 1, wherein the first microwave window functions as a concave lens for the microwave.

6. The wafer processing apparatus of claim 1, wherein the first microwave window functions as a convex lens for the microwave.

7. The wafer processing apparatus of claim 1, wherein a focal length of the first microwave window is within a range from about −1000 mm to about −100 mm or a range from about 100 mm to about 1000 mm.

8. The wafer processing apparatus of claim 1, wherein the transmittance of the transmittance adjusting coating on the circular region of the first microwave window is less than the transmittance of the transmittance adjusting coating on the ring-shaped region of the first microwave window.

9. The wafer processing apparatus of claim 1, wherein a thickness of the transmittance adjusting coating is within a range from about 0.1 mm to about 50 mm.

10. The wafer processing apparatus of claim 1, wherein the circular region is centered on an optical axis of the microwave window.

11. A wafer processing apparatus comprising:
a chamber body comprising a cavity region into which a microwave is introduced and a process region in which electron cyclotron resonance (ECR) plasma is generated;
a microwave window between the cavity region and the process region;
a showerhead between the microwave window and the process region of the chamber body; and
a magnetic field supplying device configured to apply a magnetic field inside the chamber body to adjust a position where the ECR plasma is generated,
wherein a refractive index of the microwave window varies according to a distance from an optical axis of the microwave window,
the microwave window comprises a circular region and a ring-shaped region surrounding the circular region,
the microwave window further comprises a transmittance adjusting coating thereon, and
a transmittance of the transmittance adjusting coating on the circular region of the microwave window is different from a transmittance of the transmittance adjusting coating on the ring-shaped region of the microwave window.

12. The wafer processing apparatus of claim 11, wherein a thickness of the microwave window is less than a wavelength of the microwave.

13. The wafer processing apparatus of claim 11, wherein a top surface and a bottom surface of the microwave window are flat surfaces.

14. The wafer processing apparatus of claim 11, wherein the circular region is centered on an optical axis of the microwave window.

15. A wafer processing apparatus comprising:
a chamber body comprising a cavity region into which a microwave is introduced and a process region in which plasma is generated;
a microwave window between the cavity region and the process region and having formed thereon a transmittance adjusting coating, wherein a top surface and a bottom surface of the microwave window are substantially flat surfaces;
a showerhead between the microwave window and the process region of the chamber body; and
a magnetic field supplying device configured to apply a magnetic field inside the chamber body,
wherein the microwave window comprises a circular region centered on an optical axis of the microwave window and a ring-shaped region surrounding the circular region, and
a transmittance of the transmittance adjusting coating on the circular region of the microwave window is different from a transmittance of the transmittance adjusting coating on the ring-shaped region of the microwave window.

16. The wafer processing apparatus of claim 15, wherein the transmittance adjusting coating faces the cavity region or the process region.

* * * * *